United States Patent
Ambady

(10) Patent No.: US 7,318,736 B1
(45) Date of Patent: Jan. 15, 2008

(54) BURN-IN SOCKETS FOR BGA IC DEVICES HAVING AN INTEGRATED SLIDER WITH FULL BALL GRID COMPATIBILITY

(75) Inventor: Prasanth Ambady, Providence, RI (US)

(73) Assignee: Sensata Technologies, Inc., Attleboro, MA (US)

( * ) Notice: Subject to any disclaimer, the term of this patent is extended or adjusted under 35 U.S.C. 154(b) by 0 days.

(21) Appl. No.: 11/463,114

(22) Filed: Aug. 8, 2006

(51) Int. Cl.
*H01R 13/62* (2006.01)
(52) U.S. Cl. .................................. 439/259
(58) Field of Classification Search ............... 439/259, 439/264, 266, 268, 330, 331, 342; 324/755, 324/158.1
See application file for complete search history.

(56) References Cited

U.S. PATENT DOCUMENTS

| 6,402,537 | B2 | 6/2002 | Ikeya | |
|---|---|---|---|---|
| 6,614,247 | B2 | 9/2003 | Ikeya et al. | |
| 2006/0046531 | A1* | 3/2006 | Sinclair | 439/70 |
| 2006/0205256 | A1* | 9/2006 | Hoppe | 439/260 |
| 2006/0228926 | A1* | 10/2006 | Sato et al. | 439/259 |
| 2006/0246758 | A1* | 11/2006 | Sinclair | 439/259 |
| 2007/0004261 | A1* | 1/2007 | Hayakawa | 439/331 |

* cited by examiner

*Primary Examiner*—Chandrika Prasad
(74) *Attorney, Agent, or Firm*—Russell E. Baumann

(57) ABSTRACT

A slider 24 that integrates adaptor alignment and anti-stick features is shown for use in a socket for mounting BGA type IC devices for burn-in tests. Slider 24 has a top wall surface 14b formed with a plurality of apertures in a grid array defined by intersecting ribs 14e, 14f. A plurality of wall extension portions 14h are formed extending upwardly from portions of x-direction ribs that serve as fine alignment features with an IC device 2 adapted to be placed on the flat top end surface of the wall extension portions between rows of IC device solder ball terminals 2a. Anti-stick fingers 24c extend in the x-direction from wall extension portions 24b along a y-direction rib defining the outer limit of the first column 14s of apertures of the main grid. A concave surface 24d is formed in each finger facing wall portions 24b and the height of wall portions 24b is limited to a location below the position of solder balls of an IC device mounted in the socket to provide clearance for a mechanical support ball positioned in the first column of apertures next to wall extension portion 24b outside the main grid field to provide full grid array capability.

4 Claims, 5 Drawing Sheets

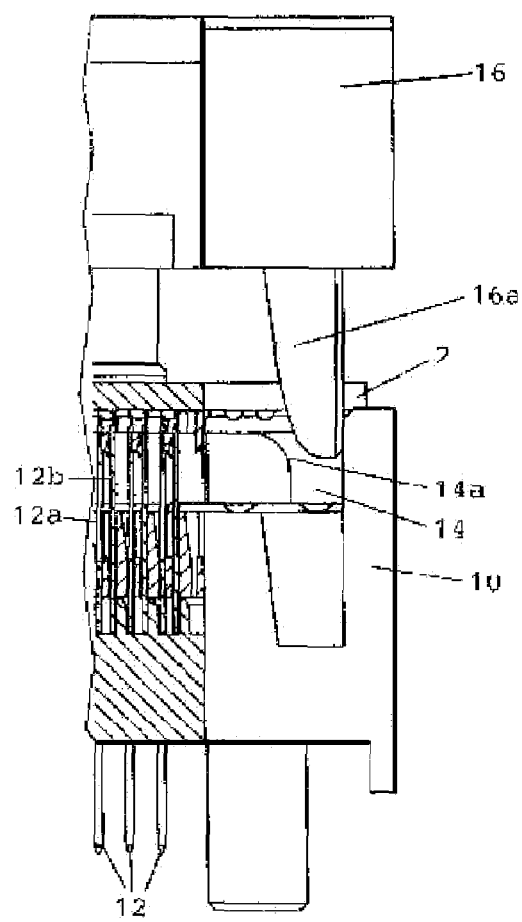 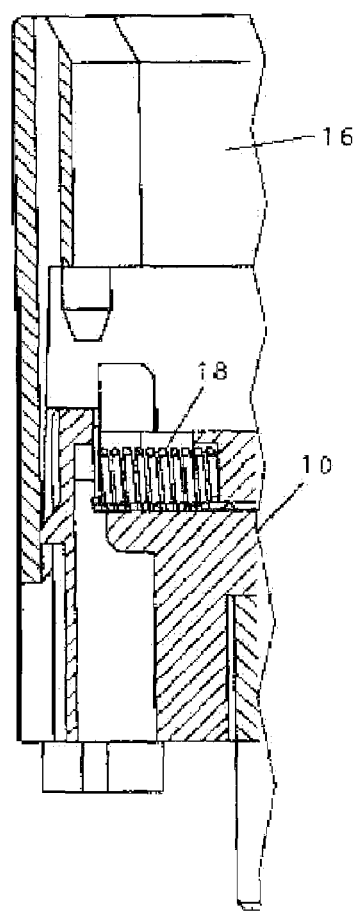
FIG. 1
FIG. 2

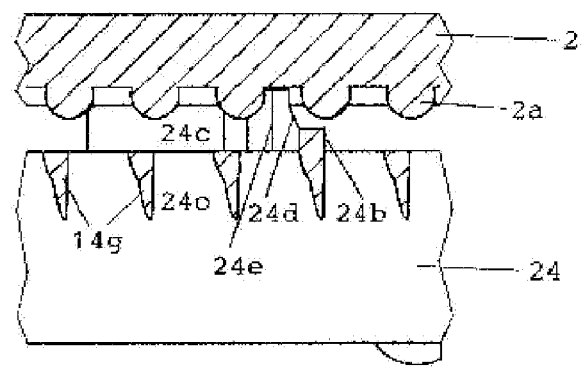
FIG. 8
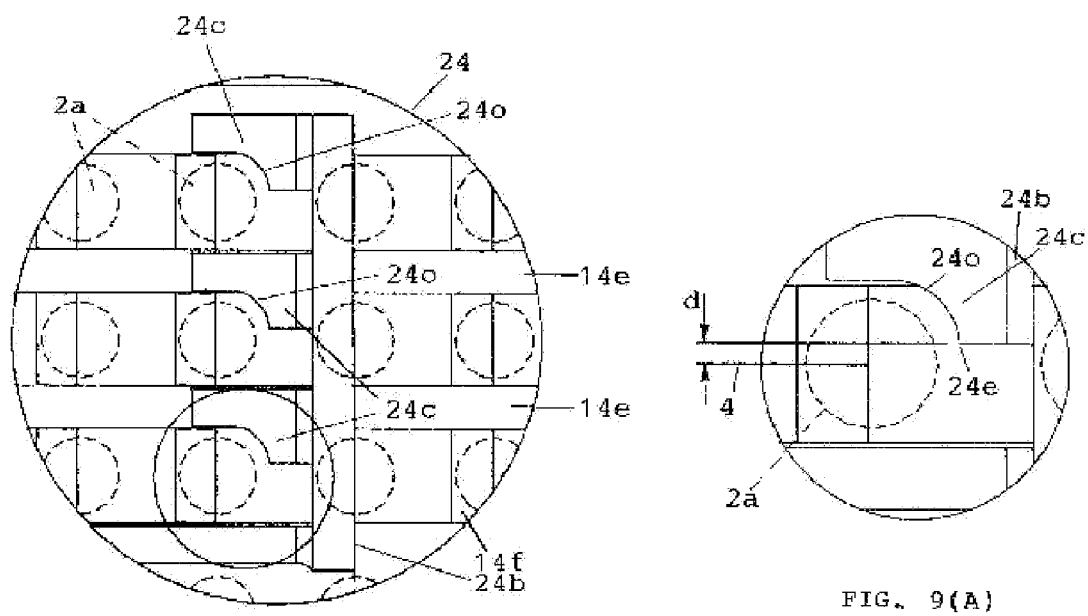
FIG. 9
FIG. 9(A)

BURN-IN SOCKETS FOR BGA IC DEVICES HAVING AN INTEGRATED SLIDER WITH FULL BALL GRID COMPATIBILITY

FIELD OF THE INVENTION

This invention relates generally to a socket for removably loading an IC device having a large number of solder ball terminals arranged in a grid array (BGA terminals) in order to make an electrical connection with each terminal and more specifically a socket having a slider formed with integral alignment and anti-stick features for accommodating different size IC device packages.

BACKGROUND OF THE INVENTION

Upon completion of their manufacture and prior to shipment, IC devices in the form of plastic encapsulated integrated circuits typically are subjected to an electrical property test in which the input-output characteristics, pulse characteristics, noise leeway, and the like of the individual IC devices are inspected. Those devices that pass the electrical property tests are then subjected to a so-called burn-in test. In this test the IC devices are placed in an oven and operated for a time at an elevated temperature, e.g., 140 degrees C., and under a voltage source that is greater than the rated value; those IC devices that continue to perform satisfactorily are then approved for shipment.

Sockets used for burn-in tests generally comprise a base for mounting a plurality of contact members for making electrical engagement with each of the electrically functional solder ball terminals of an IC device to be tested. As shown in U.S. Pat. No. 6,402,537, for example, an IC device to be tested is placed on a slider having an IC device receiving surface formed with an array of apertures that are arranged in the same pattern as the ball terminal grid array of the IC device. The slider is mounted on the base for reciprocal horizontal motion. The contact members each have two generally parallel contact beams extending into a respective aperture. A cam member is mounted on the base and is vertically movable downwardly in the z-direction toward the base against the bias of a return spring and cams the slider in an x-direction against the force of a slider return spring. A rib of the slider is disposed between each contact pair of contact beams and pushes one of the contact beams away from the other contact beam as the slider moves due to a downward force exerted by the cam when it is depressed to place the contact members in an open position to receive a corresponding ball terminal of an IC device to be loaded in the socket.

When the downward vertical force is removed from the cam member, the cam member and slider return to their original positions and with the contact beams of the contact members closing to make electrical engagement with respective terminal balls.

In order to use the same slider for IC sockets having different package sizes, it is known to use an adaptor that is custom made for a selected size that is in turn received on the slider. More recently sliders have come into use having integrated adaptor features that provide an IC device receiving seating surface with features for fine alignment as well as features for preventing or breaking free contact beams that may tend to stick to the terminal balls in preparation for removal of the IC devices from the socket at the conclusion of the testing procedure. An example of this type of integrated slider is shown in FIG. 3. In this type of slider having a grid array of apertures formed by intersecting x and y direction ribs, a plurality of wall extension portions extend upwardly along x-direction ribs from the top surface of the integrated slider. These wall extension portions have a common width with the ribs and provide a mesa like IC seating surface on each top end surface of the extension wall portions for receipt thereon of an IC device to be seated. The wall extension portions of a first set include several that are spaced apart in the y-direction a distance generally equal to the y-direction width of an aperture and are adapted to be received between x-direction rows of terminals of an IC device placed thereon to provide fine alignment.

A second set of two similar wall extension portions extend in the y-direction and have a width essentially the same as that of the ribs defining the apertures in that direction. The two wall extension portions of the second set are aligned with one another in the y-direction and are located contiguous to the first column (y-direction) of apertures corresponding to the main grid being employed in the IC device to be tested at one end of the main grid layout for the solder ball terminals of an IC device to be tested.

Extending from each of the second set of extension wall portions is an anti-stick feature in the form of a finger extending in the x-direction along respective x-direction ribs defining one side of the aperture of the first column and extending over that aperture. The fingers are each formed with a concave surface adapted to engage the center of a respective solder ball upon movement of the integral slider in the opening direction to thereby push the solder ball away from a respective contact beam providing an anti-stick function.

In this arrangement the first and second beams of each contact member extend through two adjacent apertures in an x-direction row with the rib separating the two apertures serving as a contact engagement and actuating member. The first and second beams extend in the z-direction above the top surface of the integrated slider defining the apertures but slightly below the IC device mesa like seating surfaces of the alignment wall extension portions.

The integrated slider discussed above accommodates different size packages while providing fine alignment of the IC device ball grid array relative to the contacts as well as an anti-stick function. However, as variations in the placement of dummy or outrigger balls for providing mechanical support for the IC device proliferate there are certain variations that cannot be accommodated in the prior art integrated slider, particularly due to the anti-stick structure that interferes with any aperture location immediately adjacent to the anti-stick features in the first y-direction column of apertures outside the area defined by the main grid of apertures for the electrically functioning solder ball terminals.

SUMMARY OF THE INVENTION

An object of the present invention is the provision of an apparatus that overcomes the above noted limitations in the prior art. Another object of the invention is the provision of a socket slider having integrated fine alignment and anti-stick features that provides a full grid capability for BGA type IC sockets that allows for use of the slider with different size IC packages.

Briefly stated, the integrated slider made in accordance with the preferred embodiment of the invention is capable of receiving a BGA type IC device without interference problems regardless of the placement of mechanical support balls while still providing the alignment and anti-stick features of the prior art integrated slider. In the integrated slider of the invention, wall extension portions extend upwardly from the top surface of the integrated slider and in the y-direction along the y-direction rib defining the outer extremity of the first column of apertures of the main grid field and have anti-stick fingers comprising a finger projecting in the x-direction for essentially one aperture in length with each finger extending over slightly less than one half of the respective aperture by a distance d.

According to a feature of the invention a concave surface in which the concave profile is defined in an x-z plane is provided in the top surface of the fingers facing the y-direction wall extension portions and away from the main grid field. Further, the height of the y-direction wall extension portions is limited to a location below the position of an IC device solder ball seated in the slider. This provides a structure that is capable of being molded while still providing sufficient structural strength for the fingers as well as being able to accommodate mechanical support balls even when they are located in alignment with the column of apertures immediately adjacent to the main grid.

According to another feature of the invention, each finger is formed with a concave surface at its distal end in which the concave profile is defined in an x-y plane so that the finger will engage a ball slightly off center applying a skewed force while providing additional clearance for the sole contact beam in the respective aperture. Thus the concave ball receiving surface of each finger disposed over the first aperture in the first y-direction column in the main grid field are adapted to engage a respective ball terminal and push it away from the respective contact beam in the event of any sticking as the slider is moved horizontally when the cover is depressed following the completion of a test procedure in order to facilitate removal of the IC device from the socket.

BRIEF DESCRIPTION OF THE DRAWINGS

Other objects, advantages and details of the socket and improved and novel adaptor integrated slider of the invention appear in the following detailed description of the preferred embodiments of the invention, the detailed description referring to the drawings in which:

FIG. 1 is an elevational view, partly in cross section, showing a broken away portion of a conventional BGA type IC device receiving socket shown with an IC device 2 loaded therein;

FIG. 2 is another cross sectional, elevational view of a broken away portion of the FIG. 1 socket;

FIG. 8 is a view similar to FIG. 5 but showing the compatibility of BGA type IC device mechanical support balls with the anti-stick fingers; and FIG. 9 is a view similar to FIG. 6 showing a top plan view of the anti-stick fingers and IC device solder balls relative to the apertures of the slider; and FIG. 9(A) is a still further enlarged portion of FIG. 9.

DETAILED DESCRIPTION OF PREFERRED EMBODIMENT

Figure 3:
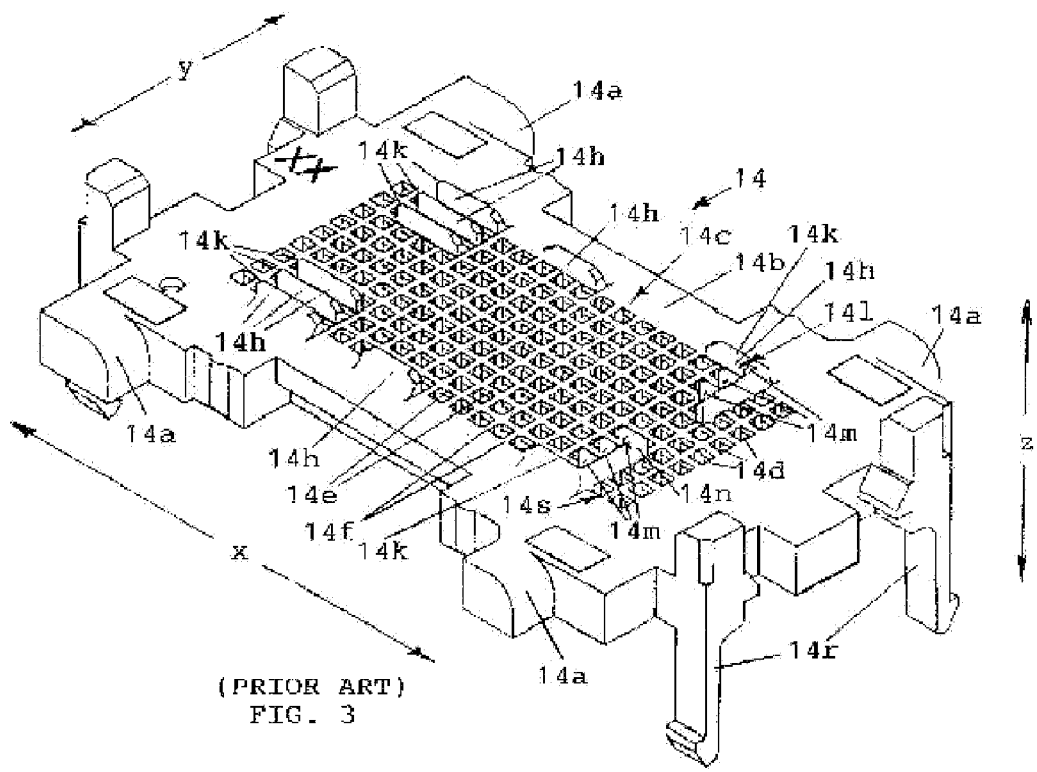
FIG. 3 is a perspective view of a BGA type IC device receivable, integrated slider having adaptor features for a socket such as that shown in FIGS. 1, 2.

IC device sockets for providing temporary interconnection of the terminals of the device for burn-in procedures are well known. In the case of IC devices having BGA solder ball terminals, such sockets typically comprise a base of electrically insulative material in which a contact member is mounted for each functional terminal of the IC device to be tested. Each contact member has two elongated contact beams that extend upwardly toward a seating surface adapted to receive the IC device. A slider is mounted for horizontal reciprocal sliding motion on the base and a window shaped cover having a central IC device receiving opening is vertically movable toward and away from the base. In one type of socket arrangement, cam surfaces are provided on the cover and are adapted to engage cam follower surfaces on the slider when the cover is moved toward the base to cam the slider in a first horizontal direction against the bias of a return spring. Contact engagement rib members are fixedly connected to the slider with one such member received between the first and second contact beams of each contact member so that downward movement of the cover and concomitant sliding movement of the slider in the first horizontal direction causes the contact engagement rib member to engage the first contact beam of each contact member and move the beam away from the second contact beam of the respective contact member thereby allowing a BGA type IC device being loaded through the window of the cover of the socket to be placed on a seating surface with the terminal balls received between respective contact beams of the contact members. When the force depressing the cover into the downward position is removed, return springs extending between the base and the cover cause the cover to return to its elevated position and the slide return springs mounted in the base and reacting on the slider cause the slider to return to its original at rest position.

An example of this type of socket is shown in part in FIGS. 1 and 2 where a base 10 mounts a plurality of contact members 12 having first and second flexible elongated contact beams 12a, 12b respectively that extend upwardly toward a seating surface on a slider 14. As seen in FIG. 1, an IC device 2 is received on slider 14 with the contact beams of contact members 12 in engagement with respective IC device solder balls 2a. Cover 16 is shown in its elevated, at rest position with cams 16a (one being shown) projecting downwardly from the cover. When a downward force is applied to the cover against the force of return spring members (not shown) urging the cover to the elevated position, the cover moves vertically toward the base and cams 16a engage a follower cam surface 14a on the slider (one being shown in FIG. 1) causing horizontal movement of the slider against the force of slider return springs 18 (one slider return spring 18 shown in FIG. 2).

Typically, a specific adaptor custom made for a selected IC device package size is disposed on a conventional slider in order to place a device to be tested in a properly aligned position upon loading of the IC device in the socket. The adaptor also serves to transfer a force to separate any solder balls that may be sticking to the respective contact beams upon removal. Slider 14 shown in FIG. 3 provides the capability of accommodating various BGA type IC device package sizes and has integrated adaptor features thereby obviating the need for a separate adaptor.

Prior art slider 14 is provided with legs 14r for receipt in suitable slots (not shown) in base 10 allowing reciprocal horizontal motion. The slider has a top surface 14b formed with a centrally disposed grid array 14c of apertures 14d. The apertures are defined by a plurality of ribs 14e extending in an x-direction intersected by a plurality of ribs 14f extending in a y-direction with the depth of the ribs corresponding generally to their width. The y-direction ribs 14f are formed with tongues 14g (see FIG. 5) depending downwardly from the ribs with the tongue portion serving as contact engaging members. When mounted in a socket, the contact beams 12a, 12b of each contact member are received in two adjacent apertures in an x-direction row on opposite sides of a y-direction rib.

Slider 14 has a plurality of alignment wall extension portions 14h that extend upwardly above top surface 14b to an end seating surface 14k forming mesa like seats for a BGA type IC device 2. Wall extension portions 14h are formed with essentially the same thickness as the x-direction ribs 14e and are adapted to be received between rows of solder balls terminals of an IC device package as well as similar wall extension portions defining the outer extremity of the apertures of the main grid field in the y-direction thereby providing fine alignment of the solder balls relative to the contact beams.

Figures 4, 4A, 4B:
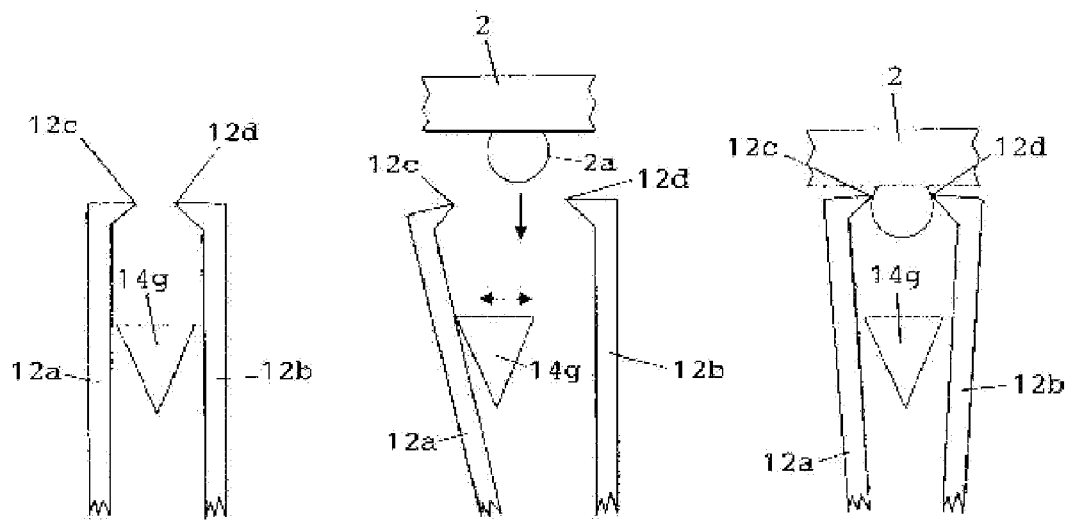
FIG. 4 is a schematic diagram showing an elevational view of the position of the two broken away contact beams of a contact member relative to the contact engagement rib member when in the at rest position, i.e., with no IC device loaded in the socket.
FIG. 4(A) is a view similar to FIG. 4 but showing the contact engagement rib member engaging a contact beam for moving it to an open position to allow a ball terminal of an IC device to be moved between the contact beams.
FIG. 4(B) is a view similar to FIG. 4 but showing the contact beams and contact engagement rib member when the cover has returned to its normal, at rest position with an IC device loaded in the socket.

When the cover is lowered, contact engagement rib members, tongues 14g, move from a position between and out of engagement with the contact members (see FIG. 4) to engage a respective contact beam 12a, see FIG. 4(A), and apply a direct force to the contact beam upon lowering of cover 16 to open the contact members to allow seating of the IC device and then when the cover is allowed to return to its elevated position the contact members close to make electrical engagement with respective solder ball terminals 2a, see FIG. 4(B), in preparation for the test procedure.

As part of the test procedure, the temperature of the IC device is raised to a selected elevated level, e.g., 140 degrees C., and as a result, the pointed contact tips 12c, 12d penetrate into the ball as the higher temperatures soften the solder and this can cause the contacts to stick to the balls upon opening of the contact members. Upon the conclusion of the test procedure, the cover is again lowered and contact engagement rib members 12g move to the FIG. 4(A) position pushing contact beams 12a away from respective solder balls thereby dislodging these contact beams from the solder ball terminals to allow opening of the contact members for removal of the IC device.

Figure 4C:
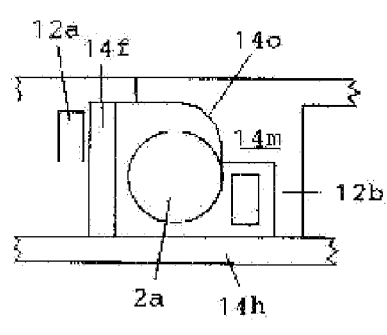
FIG. 4(C) is a schematic diagram showing a top plan view of a prior art anti-stick finger engaging a terminal ball to prevent sticking of the other contact beam of the contact member.
Figure 6:
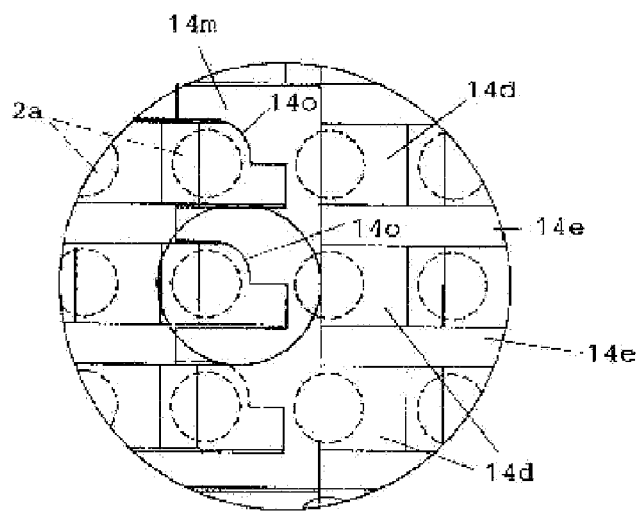
FIG. 6 is an enlarged top plan view showing a portion of the anti-stick fingers along with the position of IC device solder balls, shown in dashed lines relative to the contact receiving apertures.
Figure 6A:
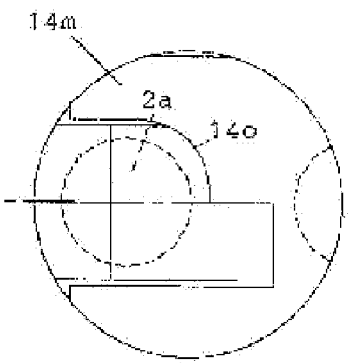
FIG. 6(A) is a still further enlarged portion of FIG. 6.

Further, in order to prevent sticking of the other contact beams 12b of the contact members 12 to solder ball terminals, slider 14 is formed with anti-stick features 14l in the form of fingers 14m that extend upwardly from the top surface 14b and extend in the x-direction along corresponding x-direction ribs from the y-direction rib defining the main grid field of apertures, i.e., those apertures adapted to receive the first column (y-direction) of solder balls of an IC device that perform an electrical function. Fingers 14m, see also FIGS. 6 and 6(A), extend from two spaced apart portions of y-direction wall extension portions 14n defining a side boundary of the active main field of grid 14b as well as from a wall extension portion 14h at either y-direction extremity of field 14c and joined to respective wall extension portions 14n. Fingers 14m extend over the adjacent aperture 14d from wall extension portion 14h and x-direction ribs 14e to a location that defines the y-direction center shown by axis 4 of the respective aperture, see FIG. 6(A), and are each formed with a concave surface 14o having a concave profile in an x-y plane slightly spaced from the position of a corresponding solder ball when in the at rest position. The apertures 14d over which the fingers 14m are disposed receive only one contact beam 12b, see FIG. 4(C), since contact beam 12a of the respective contact member is received in the adjacent aperture. Thus when the cover is depressed, each finger 14m, moves with slider 14 and engages a solder ball in the first column to apply a force to the solder ball to push it away from the corresponding contact beam 12b in the event of a tendency of the contact beam to stick to the solder ball. This has been effective to push the solder balls away from contact beams 12b.

Figure 5:
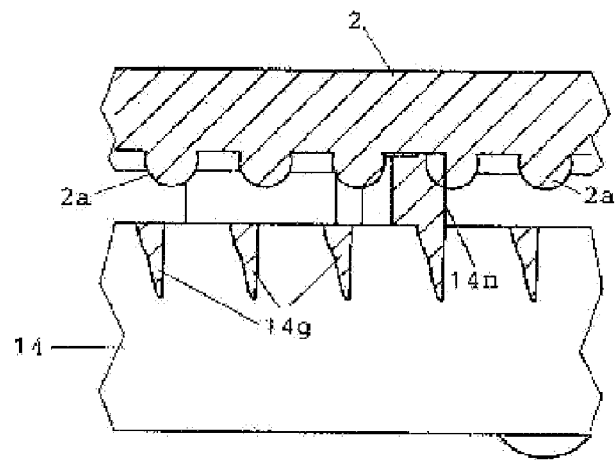
FIG. 5 is an enlarged simplified cross sectional, elevational view taken through one of the anti-stick fingers of the FIG. 3 adaptor integrated slider parallel to the x-direction and intermediate to two x-direction ribs shown with a portion of an IC device in cross section to illustrate the interference of a mechanical support ball with the alignment and anti-stick features.

Slider 14, having the integrated fine alignment and anti-stick adaptor functions, has been successfully used for IC device packages having additional mechanical support solder balls that have been located in various locations outside the main grid such as in the corners of the bottom surface of the IC device. However, in some IC device designs one or more mechanical support balls are located immediately adjacent to the y-direction wall extension portions 14n in column 14s creating an interference problem between portions 14n and the mechanical support ball 2a in that location as shown in FIG. 5 so that adaptor integrated slider 14 is not usable with IC devices having a solder ball that aligns with the apertures in the y-direction column 14s immediately adjacent to the wall extension portions 14n.

Slider 24 made in accordance with the preferred embodiment of the invention integrates alignment and anti-stick features but also provides full ball grid capability allowing reception of an IC device package without any interference problems in which one or more mechanical support balls are located immediately adjacent to the main (electrically functional) grid in the x-direction of the grid.

Figure 7:
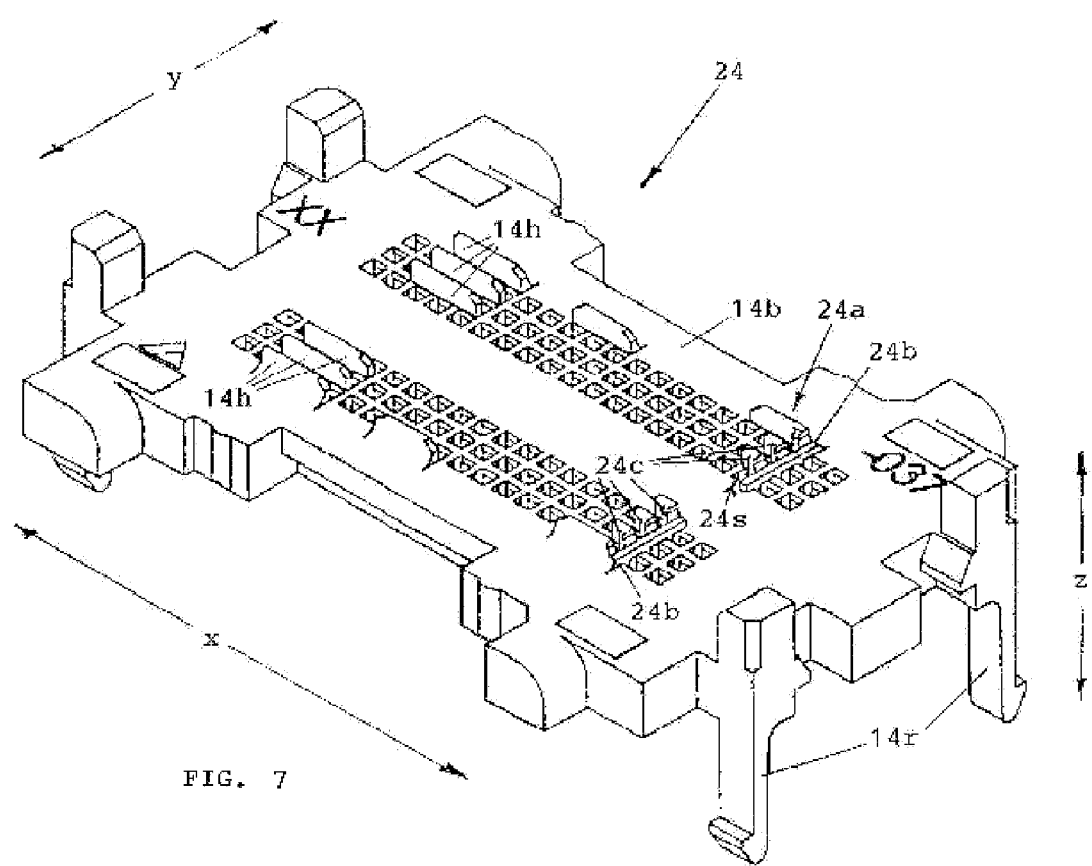
FIG. 7 is a perspective view of a BGA type IC device receivable, adaptor integrated slider for a socket of the type usable in the FIGS. 1, 2 socket made in accordance with the preferred embodiment of the invention.

With reference to FIGS. 7-9, the anti-stick feature 24a of adaptor integrated slider 24 comprises a wall extension portion 24b extending in two sections along the y-direction rib 14f defining the beginning of the main grid apertures 14d on the right side of the grid, as seen in FIG. 7. Fingers 24c extend from wall extension portion 24b along respective x-direction ribs 14e for a length of one aperture, similar to fingers 14m of slider 14. The height of wall extension portion 24b is limited to a location below the position of an IC device solder ball seated in slider 24, as best seen in FIG. 8. A concave surface 24d having its concave profile in an x-z plane is formed in the upper portion of fingers 24c on the side thereof extending away from the grid array side of wall extension portion 24b. The concave surface 24d forms clearance for any solder ball that may be located in the first column immediately adjacent to the main grid of y-direction apertures as can be seen in FIG. 8.

As best seen in FIG. 9(A), each finger 24c projects over the respective aperture in the first y-direction column 24s in the main grid field from x-direction rib 14e to a location offset a distance d from the y-direction center of the respective aperture at axis 4. The fingers are each provided with a concave surface 24o having the concave profile in an x-y plane extending from the respective x-direction aperture defining rib 14e to which it is appended to form a terminal ball engaging portion 24e so that upon sliding motion of slider 24 to the left as seen in the drawing concomitant with lowering of the socket cover 16, engagement portion 24e will engage and apply an off center push to any terminal ball that tends to stick to a corresponding contact beam. The offset d provides extra clearance as well as applying a skewed force to the contact beam helping to ensure dislodgement of a contact beam from a respective solder ball.

With reference to FIG. 8, wall extension portion 24b provides support for fingers 24c with concave surface 24d providing clearance for a solder ball 2a and with fingers 24c serving an anti-stick function by virtue of engagement portions 24e with a respective solder ball.

In other respects the description of slider 24 is the same as that of slider 14 and need not be repeated.

In view of the above, it will be seen that the several objects of the invention are achieved and other advantageous results attained. As other changes could be made in the above constructions without departing from the scope of the invention, it is intended that all matter included in the above description or shown in the above drawings be interpreted as illustrative and not in a limiting sense.

What is claimed:

1. A socket for removably mounting an IC device having a plurality of ball-shaped terminals arranged in a selected matrix from the bottom surface of the IC device comprising:
   a base having a top surface,
   a plurality of elongated contact members mounted in the base, each contact member having first and second generally parallel flexible contact beams extending upwardly from the base and being movable relative to each other between open and closed positions,
   a slider having a top surface and a separate IC device seating surface, the slider being disposed on the top surface of the base for reciprocal sliding movement relative to the base, a cam follower surface formed on the slider, a slider return spring mounted in the base urging the slider in a first given direction,
   a cam movably mounted for vertical movement toward and away from the base, the cam being engageable with the cam follower surface for causing the slider to move in a second direction opposite to the first given direction to open the contact members in dependence on movement of the cam against the urging of the slider return spring,
   the slider having a plurality of apertures of a grid array formed by intersecting x-direction and y-direction extending ribs, a plurality of wall extension portions of the x-direction ribs extending upwardly beyond the top surface of the slider to a top end wall surface at a common distance from the top surface of the slider, the top end wall surfaces forming the IC device seating surface, the wall extension portions adapted for placement between rows of x-direction ball-shaped terminals of an IC device mounted thereon, and the free end of the contact beams extending through apertures of the slider to a location above the top surface of the slider but slightly below the IC device seating surface, each contact beam of a contact member disposed on opposite sides of a y-direction rib,
   an upwardly extending wall extension portion of a y-direction rib forming the outer y-dimension rib of the grid array in an x-direction in which a contact beam is received, the wall extension portion extending across a plurality of rows of apertures, an upwardly extending wall extension portion of an x-direction rib on one side of each of the said apertures and extending to an end at a distance of approximately one aperture in the x-direction length and extending at least partially over the respective apertures forming anti-stick fingers, a concave surface forming a concave profile in an x-y plane formed in each finger at the end thereof for receipt of a respective ball terminal, a concave surface formed in the top surface of each finger, the concave surface having a concave profile in an x-z plane facing the y-direction wall extension portion and the y-direction wall extension portion extending above the top surface of the slider to a location below the position of a solder ball of an IC device mounted on the slider to provide clearance for supplemental non terminal solder balls of an IC device.

2. A socket according to claim 1 in which the fingers extend over the respective apertures in the y-direction from the x-direction rib forming part of the respective finger to a location less than one half the distance to the other x-direction rib defining a side of the respective aperture.

3. An integrated slider having adaptor functions for use in a burn-in socket comprising:
   a slider having a top surface and a separate IC device seating surface, the slider having a plurality of apertures of a grid array of x-direction aperture rows and y-direction aperture columns formed by intersecting x-direction and y-direction ribs, a plurality of wall extension portions of the x-direction ribs extending upwardly beyond the top surface of the slider to a top end wall surface at a common distance from the top surface of the slider, the top end wall surfaces forming an IC device seating surface, the wall extension portions adapted for placement between rows of x-direction ball-shaped terminals of an IC device mounted thereon,
   a wall extension portion of a y-direction rib extending upwardly and across a plurality of rows of said apertures, a wall extension portion extending upwardly and in the x-direction on one side of each of the said apertures and having an end at a distance of approximately one aperture in the x-direction length and extending over a portion of the respective apertures forming anti-stick fingers, a concave surface forming a concave profile in an x-y plane formed in each finger at the end thereof for receipt of a respective ball terminal and a concave surface having a concave profile in an x-z plane formed in the top surface of each finger facing the y-direction wall extension portion and the y-direction wall extension portion extending above the top surface of the slider to a location below the position of a solder ball of an IC device mounted on the slider to provide clearance for supplemental non terminal solder balls of an IC device.

4. A slider according to claim 3 in which the anti-stick fingers extend over the respective apertures in the y-direction from the x-direction rib forming part of the respective finger to a location less than one half the distance to the other x-direction rib defining a side of the respective aperture.

* * * * *